United States Patent [19]

Oakland et al.

[11] Patent Number: 5,784,575
[45] Date of Patent: Jul. 21, 1998

[54] OUTPUT DRIVER THAT PARKS OUTPUT BEFORE GOING TRISTATE

[75] Inventors: Steven F. Oakland, Colchester, Vt.; Bijit T. Patel, Emmaus, Pa.; Patrick E. Perry, Essex Junction, Vt.

[73] Assignee: International Business Machines Corporation, Armonk, N.Y.

[21] Appl. No.: 685,128

[22] Filed: Jul. 24, 1996

[51] Int. Cl.[6] .................................................. G06F 13/00
[52] U.S. Cl. ........................................ 395/280; 326/80
[58] Field of Search ...................... 395/280; 326/88, 326/86, 30

[56] References Cited

U.S. PATENT DOCUMENTS

| | | | |
|---|---|---|---|
| 4,276,487 | 6/1981 | Arzubi et al. ......................... | 326/88 |
| 4,363,978 | 12/1982 | Heimbigner ........................... | 307/451 |
| 4,401,904 | 8/1983 | White, Jr. et al. ..................... | 326/88 |
| 4,488,067 | 12/1984 | Kraft et al. ........................... | 307/473 |
| 4,504,745 | 3/1985 | Spence et al. ......................... | 326/30 |
| 4,531,068 | 7/1985 | Kraft et al. . | |
| 4,540,904 | 9/1985 | Ennis et al. .......................... | 307/473 |
| 4,649,298 | 3/1987 | Tuhy, Jr. . | |
| 5,086,427 | 2/1992 | Whittaker et al. . | |
| 5,136,185 | 8/1992 | Fleming et al. . | |
| 5,230,067 | 7/1993 | Buch . | |
| 5,251,305 | 10/1993 | Murphy, Jr. et al. . | |
| 5,309,565 | 5/1994 | Hollyer et al. ........................ | 395/285 |
| 5,321,842 | 6/1994 | Fairfield et al. . | |
| 5,378,067 | 1/1995 | Severson et al. . | |
| 5,448,182 | 9/1995 | Countryman et al. .................. | 326/30 |
| 5,453,705 | 9/1995 | Atallah et al. ........................ | 326/86 |

*Primary Examiner*—Ayaz R. Sheikh
*Assistant Examiner*—David A. Wiley
*Attorney, Agent, or Firm*—Schmeiser, Olsen & Watts; Eugene I. Shkurko

[57] ABSTRACT

Disclosed is a tristate circuit driver capable of both parking the output in a deasserted state and switching to a tristate mode in less than one clock cycle. In a preferred embodiment, the driver circuitry utilized a delay device to generate a pulse signal immediately after the transition in an enable signal is detected. The pulse signal then causes the tristate driver to output a signal of a predetermined voltage for a duration of less then one clock cycle.

20 Claims, 3 Drawing Sheets

OUTPUT DRIVER THAT PARKS OUTPUT BEFORE GOING TRISTATE

BACKGROUND OF THE INVENTION

1. Technical Field

This invention relates to integrated circuit chips, and more particularly, to tristate driver circuits.

2. Background Art

Tristate driver circuits are formed on integrated circuit chips for driving bus lines and signal lines located off of the chip. Because it is not unusual to have bus lines that multiple chips need to drive, it is critical to prevent driver contention on these signal lines. The usual means to prevent contention, is to make sure that there is at least one cycle of "tristate," where no device drives the line, before a new chip can start driving it. Tristate, or stand-by mode, is an output condition wherein the tristate driver circuit causes a no-signal, high impedance state to be generated at its output terminal. When a particular device is not driving the bus, it will place its driver circuits in the tristate or high output impedance mode so as not to affect the usage of the bus by another data processing unit.

In addition to setting an output signal line to tristate mode, it is often required that the output be returned to an inactive or deasserted state before the bus can be tristated. In newer computer system designs, such as the peripheral control interface (PCI) bus architecture, sustained tristate signals (STS) are specified such that a given driver, prior to relinquishing control of the bus, must first return the bus to an inactive or deasserted state (either a low or high level, depending on the design), and then must go into a high impedance state (tristate). Because this sequencing now requires two cycles before the next driver can assume control of the bus, it means that present designs take two clock cycles to switch from one chip driving the bus to another, one cycle to drive the bus inactive or deasserted and one cycle of tristate to prevent contention. In applications where such transfers of control are frequent, the two cycle penalty is undesirable.

In addition, there are also timing reasons why it is desirable to always leave a tristate driver output in a known state before going tristate. Generally, the delay through the tristate pin is longer than the delay through the data pin, and often one of the transition delays is a little longer than the other. If the bus is always left so that when it comes out of tristate it will only have to make the faster transition, the penalty for the longer tristate pin delay may be eliminated. In addition, on a mixed three volt and five volt bus, additional penalties may be incurred by a three-volt chip if the bus is left at five volts because several additional nanoseconds will be required to pull the bus down to the three volt level. Thus, if the five volt chip always leaves the bus low, the three volt chip never has to pay that delay penalty.

Because of these and other limitations, an improved tristate driver circuit is required that overcomes the aforementioned problems.

SUMMARY OF THE INVENTION

The present invention provides an improved tristate driver circuit that will drive the output to a predetermined level before going tristate, all in one clock cycle. The invention includes means for monitoring an enable signal, means for producing a pulse (having a duration shorter than one clock cycle) immediately following a transition in the enable signal and an output driver means 1) for switching the output line to a predetermined deasserted state (e.g., 0 volts) during the duration of the pulse and 2) for switching to a tristate before an end of the clock cycle.

In a preferred embodiment, the means for creating a pulse includes a delay component along with other logical circuitry. The pulse may be a logical 1 or 0 that is generated for a duration suitable for driving the output of a tristate driver to a deasserted state. In addition to the standard driver components, the present driver means includes a "park" input line for receiving the pulse just after a transition in the enable signal occurs. In a preferred mode of operation, a pulse will only be generated when the enable signal transitions from a logical 1 to a logical 0 (or vice versa).

In accordance with the above, it is an advantage of the present invention to provide a tristate driver circuit capable of placing the driver output in a deasserted state and then in a tristate mode all within one clock cycle of a transition in an enable signal.

In accordance with the above, it is a further advantage of the present invention to eliminate pulldown resistors in order to drive a tristate driver circuit to a deasserted state.

In accordance with the above, it is a further advantage of the present invention to avoid driver contention for nets that multiple chips need to drive.

The foregoing and other objects, features and advantages of the invention will be apparent from the following more particular description of Preferred Embodiments of the Invention, as illustrated in the accompanying drawings.

BRIEF DESCRIPTION OF DRAWINGS

The preferred exemplary embodiment of the present invention will hereinafter be described in conjunction with the appended drawings, where like designations denote like elements and.

BEST MODE FOR CARRYING OUT THE INVENTION

Figure 1:
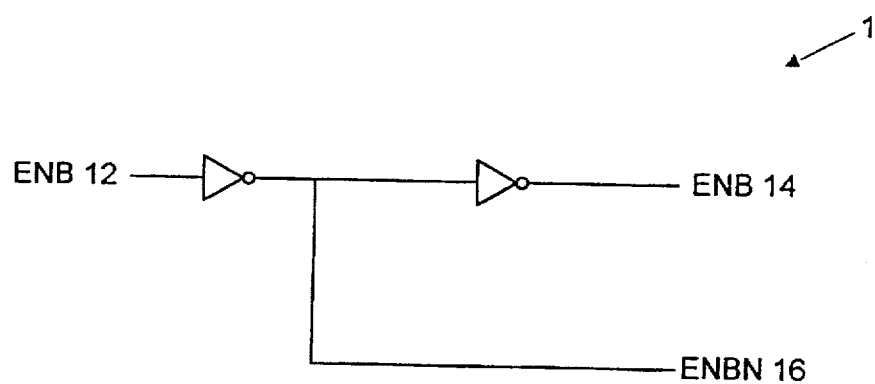
FIG. 1 depicts a circuit for generating an enable and inverted enable output signal from an enable input signal.
Figure 2:
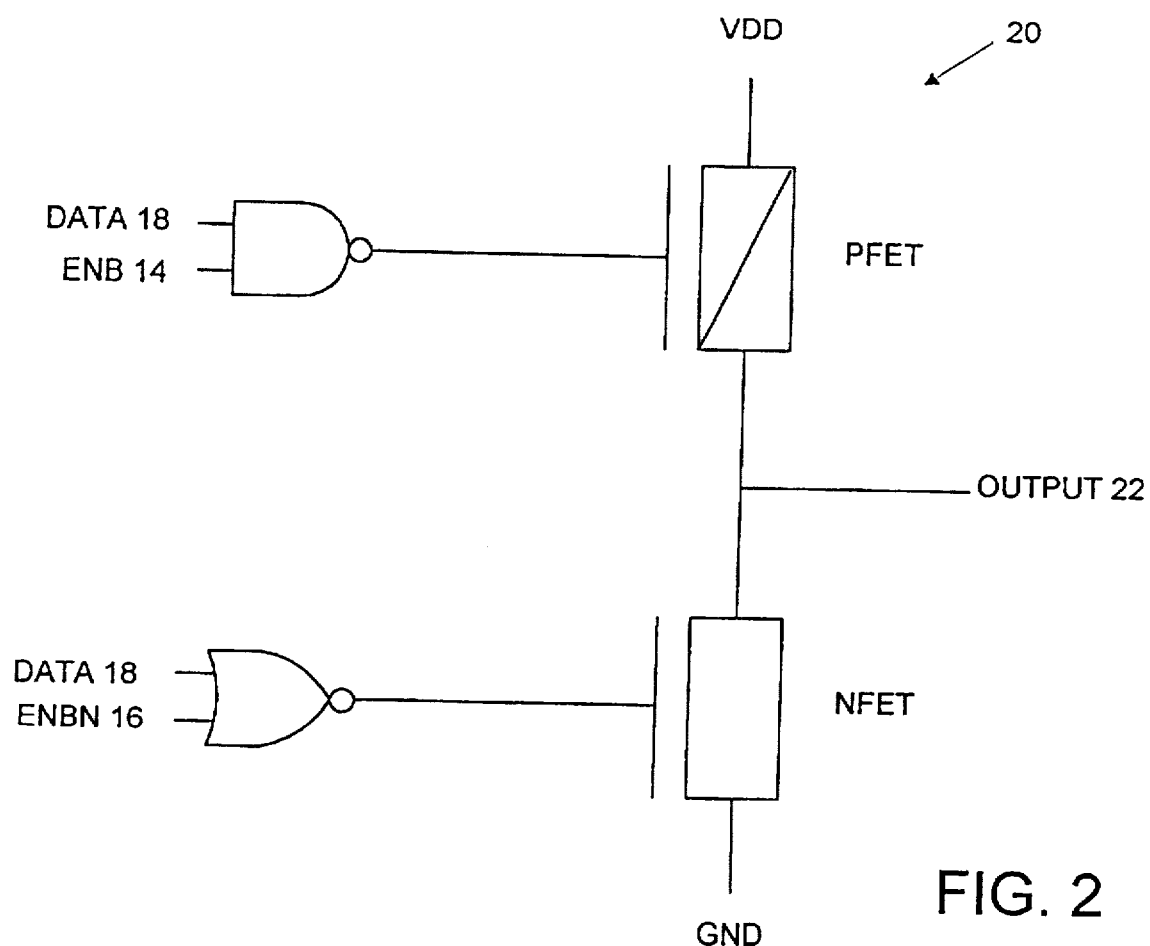
FIG. 2 depicts a typical tristate driver circuit.

Referring now to the drawings, FIGS. 1 and 2 depict logic devices that make up a typical tristate driver circuit. FIG. 1 depicts a means 10 for monitoring an enable signal 12 and then generating an enable signal 14 and an inverted enable signal 16. FIG. 2 depicts a tristate driver 20 that reads in enable signal 14 and inverted enable signal 16, along with data 18 and reproduces data 18 at output 22 while enable signal 14 is a logical 1. The output driver 20 utilizes a PFET and NFET to allow a predetermined voltage (VDD) signal to be outputted when data 18 is a logical 1 and a ground (GND) signal to be outputted when data 18 is a logical 0. However, when enable signal 14 is switched to a logical 0, output 22 is placed in a tristate mode and no data 18 passes to output 22.

As noted above, it is often desirous to leave output 22 in a known state (i.e., deasserted state) before driver 20 is placed in a tristate mode. Furthermore, it is even more desirous to use as few clock cycles as possible to perform both actions. FIGS. 3–6 describe two embodiments that will accomplish this in one clock cycle.

Figure 3:
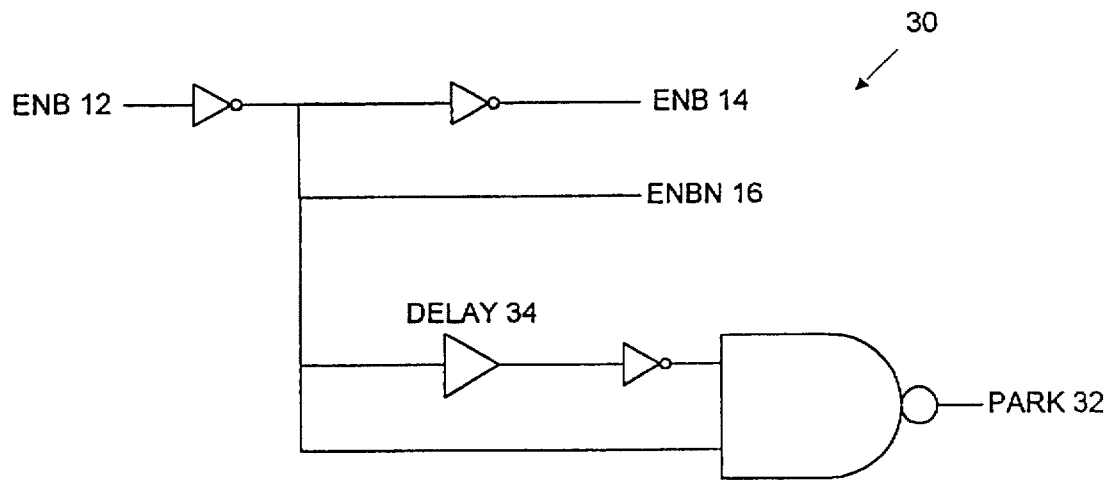
FIG. 3 depicts a circuit for generating an enable signal, an inverted enable signal and a park (pulse) signal from an enable input signal in accordance with a first preferred embodiment of the present invention.
Figure 4:
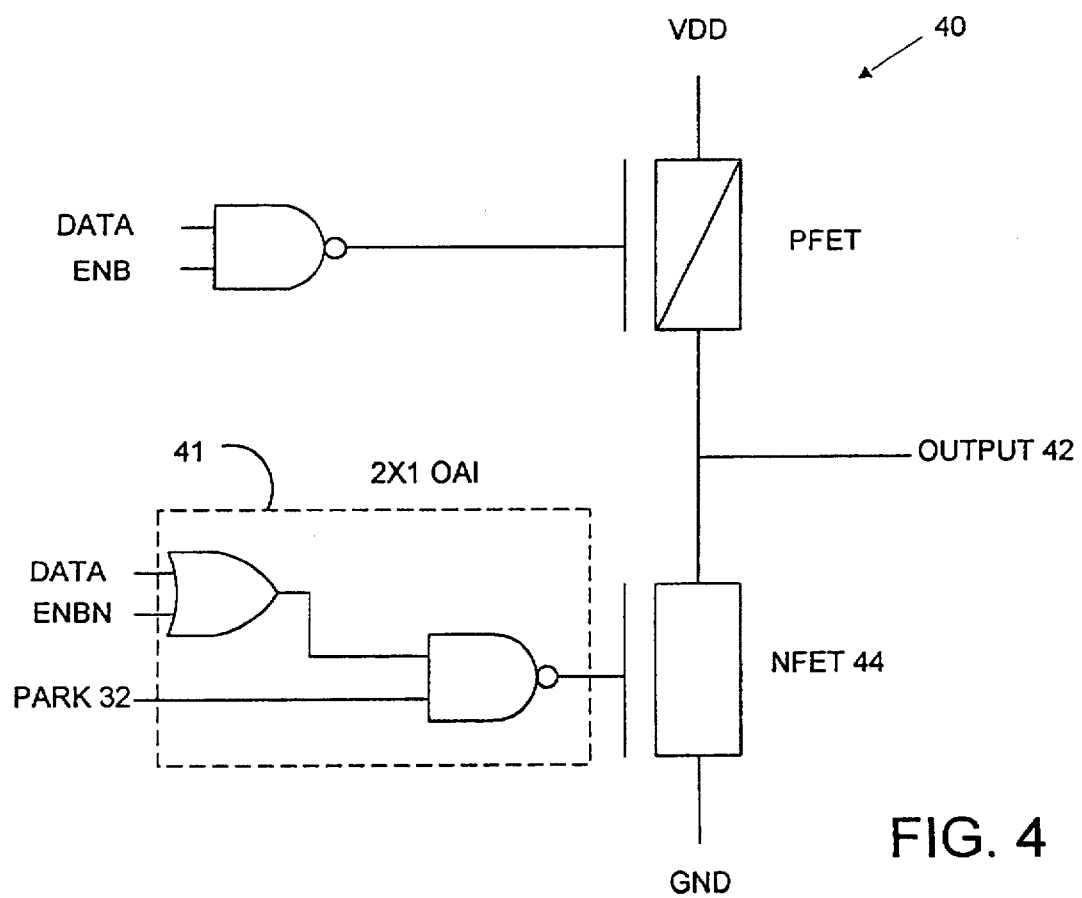
FIG. 4 depicts a tristate driver circuit in accordance with a first preferred embodiment of the present invention.
Figure 5:
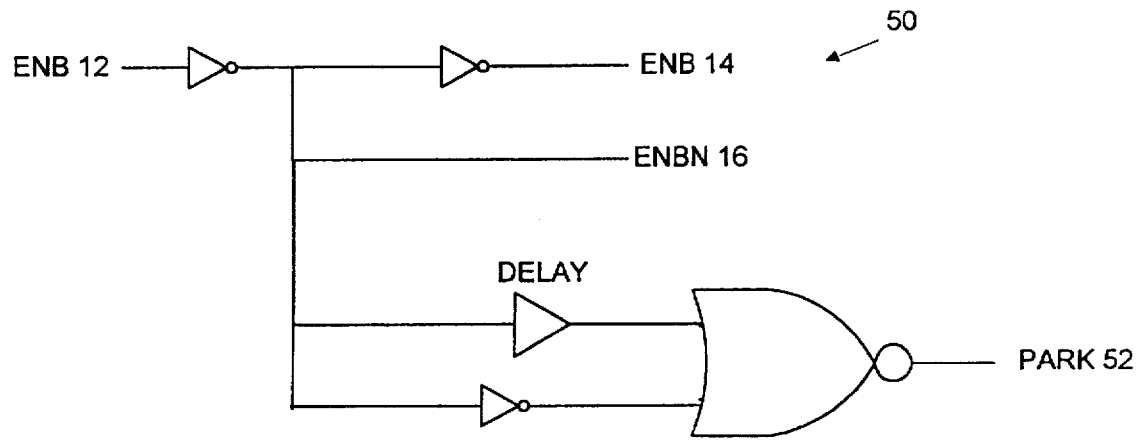
FIG. 5 depicts a circuit for generating an enable signal, an inverted enable signal and a park (pulse) signal from an enable input signal in accordance with a second preferred embodiment of the present invention.
Figure 6:
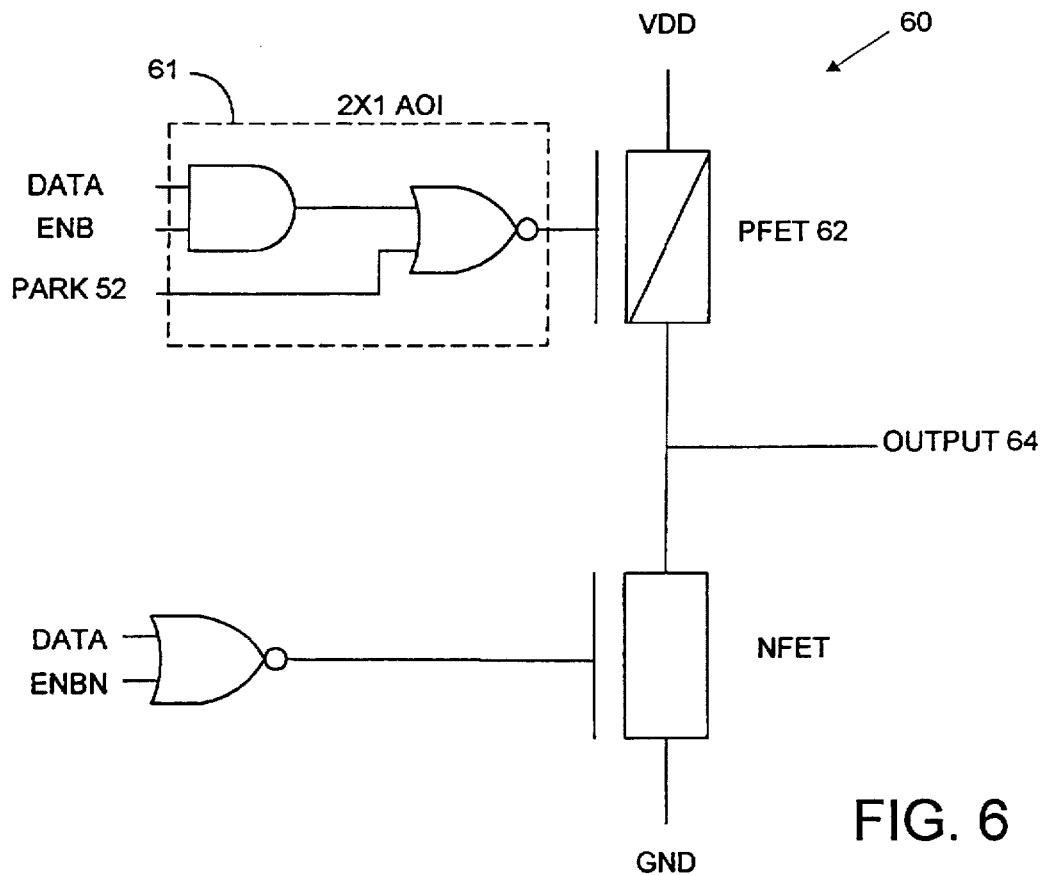
FIG. 6 depicts a tristate driver circuit in accordance with a second preferred embodiment of the present invention.

FIGS. 3 and 4 depict logic circuitry that will drive the output of driver circuit to ground prior to being placed in a tristate mode. Alternatively, FIGS. 5 and 6 depict logic circuitry that will drive the output of driver circuit to a predetermined voltage (VDD) prior to being placed in a tristate mode. Both FIGS. 3 and 5 depict means for monitoring enable signal 12, generating enable signal 14, generating inverted enable signal 16, and generating a pulse signal.

The PARK signal 32 of logic circuit 30 of FIG. 3 will be a constant logical 1 unless there is a transition in monitored enable signal 12 from a logical 1 to a logical 0. Such a transition, which indicates that the driver circuit is about to be placed in a tristate mode, causes a pulse signal (i.e., a logical 0) to be outputted for a predetermined duration immediately after the transition in the enable signal 12. While the duration of the pulse signal generally will be of a duration shorter than one clock cycle and occur immediately after the transition in the enable signal 12, it is recognized that variations may readily be made to suit the specific design needs of the driver circuit. In FIG. 3, the pulse signal is created by NANDing an inverted enable signal with a delayed enable signal to create a pulse signal that has a duration equal to the delay and begins when the enable signal 12 transitions from a logic 1 to a logical 0. While the circuitry shown here depicts one method of generating a pulse signal, it is recognized that any known method could be substituted. In addition, it is also recognized that the described system may be modified such that the pulse signal may be triggered (and the driver disabled) by a transition in the enable signal from a logical 0 to a logical 1.

Referring now to FIG. 4, an output driver means 40 is shown that provides a means for switching or parking output line 42 to a deasserted state (parking means) and for switching output line 42 to a tristate (switching means) all within one clock cycle of a transition in the enable signal from a logical 1 to a logical 0. As described above, a deasserted state is a predetermined voltage level (e.g., ground) at which the bus should be left by the driver before relinquishing control. The driver circuit 40 is similar to that shown in FIG. 2 except that it includes the PARK signal line 32 as input into a two by one OR/AND invert gate (2×1 OAI) 41. The circuit 40 also operates in the same fashion as that shown in FIG. 2 up until the time when a transition in the enable signal from a logical 1 to a logical 0 occurs. Similar to FIG. 2, upon this occurrence, no more data is allowed to pass to the output because the driver has been essentially "turned off." However, because the logical 0 pulse signal was generated over PARK line 32 after the enable signal was transitioned (see FIG. 3), a ground signal (via NFET 44) is generated over output line 42 for a short duration thereby deasserting the circuit.

As noted, FIGS. 5 and 6 detail an alternate embodiment wherein the output is deasserted by a predetermined voltage level (VDD) prior to being placed in the tristate mode. These circuits are similar to those shown in FIGS. 3 and 4 except that FIG. 4 shows a PARK signal 52 created by NORing an enable signal with a delayed inverted enable signal and FIG. 5 shows that the PARK signal 52 controls PFET 62. Like FIG. 3, FIG. 5 discloses a circuit capable of generating a pulse signal upon a transition in the enable signal 12 from a logical 1 to a logical 0. (In this case however, the generated pulse signal is a logical 1). Similar to FIG. 4, FIG. 6 discloses a circuit that will deassert the output line 64 after the driver circuit has been "turned off." In the case of FIG. 6, a pulse signal causes the output line to be deasserted to some positive voltage level when PFET 62 allows a VDD signal to drive output line 64 for a short duration.

It should be recognized for both embodiments that the exact level where the output line is to be left need not be some exact voltage. For instance, it may be adequate that the voltage level of the output line be anywhere below 2 volts in one circuit or above 4 volts in another. Additionally, in the situation where there exists mixed 3 and 5 volt devices, it may be desirous to make sure the output line is driven down from 5 volts to 3 volts. Any of these situations can be achieved by varying the duration of the pulse signal. (The longer the duration, the closer the output will be to either ground or VDD.)

While the invention has been particularly shown and described with reference to two preferred exemplary embodiments thereof, it will be understood by those skilled in the art that various changes in form and details may be made therein without departing from the spirit and scope of the invention. For instance, the driver, or switching means described above may be implemented with any practical combination of CMOS transistors, including two NFETs. Alternatively, the driver/switching means may be implemented using other types of transistor technology, such as bipolar or BICMOS transistors. Additionally, the exact type and configuration of the logic devices required to implement the driver means, switching means, pulse means, parking means, and enable signal monitoring means may include any and all known logic device combinations capable of performing an equivalent function as that described in the preferred embodiments above.

We claim:

1. An integrated circuit device having a driver circuit wherein said driver circuit comprises:

a data input line, said data input line for receiving a data signal;

an enable input line, said enable input line for receiving an enable signal;

an output line;

means for producing a pulse immediately following a transition of said enable signal, said pulse having a duration shorter than a clock cycle; and output driver means for first switching said output line to a de-asserted state during said duration of said pulse and then switching said output line to a tristate before an end of said clock cycle.

2. The integrated circuit of claim 1 wherein said de-asserted state is substantially a ground signal.

3. The integrated circuit of claim 1 wherein said de-asserted state is substantially a VDD signal.

4. The integrated circuit of claim 1 wherein said means for producing a pulse includes a delay device.

5. The integrated circuit of claim 1 wherein said pulse is a logical 1.

6. The integrated circuit of claim 1 wherein said pulse is a logical 0.

7. The integrated circuit of claim 1 wherein said means for producing a pulse immediately following a transition of said enable signal only occurs during a transition from a logical 1 to a logical 0.

8. The integrated circuit of claim 1 wherein said means for producing a pulse immediately following a transition of said enable signal only occurs during a transition from a logical 0 to a logical 1.

9. A driver circuit comprising:

a data input means for receiving data signals;

an enable input means for receiving an enable signal;

switching means for switching an output line of said driver circuit to a tristate mode after a transition of said enable signal, wherein said enable signal is distinct from said data signal;

pulse means for producing a pulse signal after said transition of said enable signal and before said output line of said driver circuit is switched to said tristate mode; and parking means for switching said output line of said driver circuit to a de-asserted state upon receiving pulse signal.

10. The driver circuit of claim 9 wherein said switching means includes a PFET and an NFET transistor.

11. The driver circuit of claim 9 wherein said switching means includes two NFET transistors.

12. The driver circuit of claim 9 wherein said pulse means is shorter than 1 clock cycle.

13. The driver circuit of claim 9 wherein said switching means switches said output line of said driver circuit to said tristate mode within one clock cycle after said transition of said enable signal.

14. The driver circuit of claim 9 wherein said parking means switches said output line of said driver circuit to said de-asserted state prior to one clock cycle after said transition of said enable signal.

15. A method for driving an output line of a tristate driver to a predetermined level prior to being driven to a tristate mode, said method including the steps of:

providing an enable input line for receiving an enable signal;

generating a pulse signal of less than one clock cycle immediately after a transition in said enable signal;

inputting said pulse to said tristate driver;

driving said output line of said tristate driver to said predetermined state upon receiving said pulse; and driving said output line of said tristate driver to a tristate mode within one clock cycle after said transition in said enable signal.

16. The method of claim 15 wherein said pulse signal is generated only after said enable signal transitions from a logical 1 to a logical 0.

17. The method of claim 15 wherein said pulse signal is generated only after said enable signal transitions from a logical 0 to a logical 1.

18. The method of claim 15 wherein said predetermined state is 0 volts.

19. The method of claim 15 wherein said predetermined state is about 3 volts.

20. The method of claim 15 wherein said predetermined state is about 5 volts.

* * * * *